(12) United States Patent  
Kutsunai et al.

(10) Patent No.: US 7,456,455 B2  
(45) Date of Patent: Nov. 25, 2008

(54) SEMICONDUCTOR MEMORY DEVICE AND METHOD FOR FABRICATING THE SAME

(75) Inventors: Toshie Kutsunai, Shiga (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 131 days.

(21) Appl. No.: 11/436,648

(22) Filed: May 19, 2006

(65) Prior Publication Data

US 2006/0267060 A1    Nov. 30, 2006

(30) Foreign Application Priority Data

May 30, 2005    (JP)    ............................. 2005-156740

(51) Int. Cl.  
*H01L 29/76*    (2006.01)  
*H01L 29/94*    (2006.01)

(52) U.S. Cl. ...................................... 257/295; 257/296

(58) Field of Classification Search ......... 257/295–296, 257/306, 310  
See application file for complete search history.

(56) References Cited

U.S. PATENT DOCUMENTS 7,186,569 B2 *    3/2007    Rinerson et al. ............... 438/3

7,190,015 B2 *    3/2007    Natori et al. ................. 257/306  
2003/0143800 A1 *    7/2003    Hall et al. ................... 438/240

FOREIGN PATENT DOCUMENTS

JP    10-242418    9/1998

* cited by examiner

*Primary Examiner*—Theresa T Doan  
(74) *Attorney, Agent, or Firm*—McDermott Will & Emery LLP

(57) ABSTRACT

A semiconductor memory device comprises: a first interlayer insulating film formed on a semiconductor substrate; a capacitor formed above the first interlayer insulating film and composed of a lower electrode, a capacitor insulating film of a high dielectric film or a ferroelectric film, and an upper electrode; a second interlayer insulating film formed over the first interlayer insulating film to cover the capacitor; a first contact plug formed in the first interlayer insulating film to penetrate the first interlayer insulating film; and a second contact plug formed in the second interlayer insulating film to penetrate the second interlayer insulating film to make connection to the first contact plug. Between the first and second contact plugs, a first oxygen barrier film is interposed to come into contact with part of the boundary area between the first and second interlayer insulating films.

11 Claims, 12 Drawing Sheets

SEMICONDUCTOR MEMORY DEVICE AND METHOD FOR FABRICATING THE SAME

CROSS-REFERENCE TO RELATED APPLICATIONS

This application claims priority under 35 U.S.C. § 119 on Patent Application No. 2005-156740 filed in Japan on May 30, 2005, the entire contents of which are hereby incorporated by reference.

BACKGROUND OF THE INVENTION (a) Fields of the Invention

The present invention relates to semiconductor memory devices with capacitor elements, such as DRAMs (Dynamic Random Access Memories), and to methods for fabricating such a device.

(b) Description of Related Art

Ferroelectric capacitors start being produced in volume as elements of planar structures having a small capacity. Recently, development has been advancing of ferroelectric capacitors having three-dimensionally stacked structures in which a ferroelectric film is formed not only over a flat portion but also over a side wall portion of an insulating film as an underlying layer. The ferroelectric capacitors with the three-dimensionally stacked structures are constructed so that a contact plug electrically connected to a semiconductor substrate is arranged immediately below a lower electrode, which reduces their cell sizes to improve their packing densities. In addition to this, formation of the ferroelectric film over a step of the insulating film as an underlying layer widens the surface area of the ferroelectric film to secure a large capacitance of the capacitor.

Ahead of the development of the ferroelectric capacitors with the three-dimensionally stacked structures mentioned above, a variety of DRAM cell structures have been proposed which have high dielectric capacitors with stacked structures employing, as capacitor insulating films, high dielectric films such as PZT (Lead Zirconate Titanate ceramics) (see, for example, Japanese Unexamined Patent Publication No. H10-242418).

Hereinafter, description with reference to the accompanying drawings will be made of a conventional semiconductor memory device with a high dielectric capacitor disclosed in, for example, Japanese Unexamined Patent Publication No. H10-242418.

First, a conventional method for fabricating a semiconductor memory device will be described with reference to the accompanying drawings.

Referring to FIG. 9A, a field oxide film 102 and a gate insulating film are formed on a substrate 101, and then a first polysilicide film is formed on the entire surface of the substrate 101. The first polysilicide film is patterned to form a word line 103. Subsequently, ion implantation using the word line 103 as a mask is performed to form a diffusion layer 104 in a surface portion of the substrate 101.

Next, a first interlayer insulating film 105 is deposited over the entire surface of the substrate 101 and the deposited film is planarized. A contact hole reaching the diffusion layer 104 is formed through the first interlayer insulating film 105, and the contact hole is filled with a polysilicon film to form a bit line contact 106. Thereafter, a second polysilicide film is deposited over the entire surface of the substrate 101, and then the second polysilicide film is patterned to form a bit line 107 and an etch stop layer 107d.

As shown in FIG. 9B, a second interlayer insulating film 108 is deposited over the entire surface of the substrate 101 and the deposited film is planarized. Thereafter, a silicon nitride film 109 is deposited on the second interlayer insulating film 108. In an area to be formed with a storage node contact, a contact hole is formed which passes through the silicon nitride film 109, the second interlayer insulating film 108, the bit line 107, the bit line contact 106, and the first interlayer insulating film 105 to reach the diffusion layer 104. Subsequently to this, a polysilicon film is deposited over the entire surface of the substrate 101 and the deposited film is planarized to form a storage node contact 110 made by filling the contact hole with the polysilicon film.

Then, a polysilicon film and a silicon oxide film are sequentially deposited over the entire surface of the substrate 101, after which these films are patterned in cylindrical shapes to form sacrifice layers 120 and 120d, a bottom portion 111a of a storage node electrode, and a bottom portion 111ad of a dummy electrode.

As shown in FIG. 9C, a polysilicon film is conformally deposited over the entire surface of the substrate 101, and then the deposited film is anisotropically etched back to form a side wall portion 111b of the storage node electrode around the sacrifice layer 120 and a side wall portion 111bd of the dummy electrode around the sacrifice layer 120d. In the manner described above, the storage node electrode bottom and side-wall portions 111a and 111b constitute the storage node electrode 111, and the dummy electrode bottom and side-wall portions 111ad and 111bd constitute the dummy electrode 111d.

As shown in FIG. 10A, the sacrifice layers 120 and 120d are removed, and the remaining storage node electrode 111 and dummy electrode 111d are conformally coated sequentially with a capacitor insulating film 112 and a polysilicon film serving as a plate electrode 113. Then, the polysilicon film, the capacitor insulating film 112, and the silicon nitride film 109 are patterned to form a capacitor 114 and a dummy pattern 114d.

As shown in FIG. 10B, a third interlayer insulating film 115 is deposited over the entire surface of the substrate 101 and the deposited film is planarized. Then, a photoresist pattern 121 with openings 121a to 121c is formed. As shown in FIG. 10C, dry etching using the photoresist pattern 121 as a mask is performed to form a contact hole 122a for the plate electrode in the second and third interlayer insulating films 108 and 115, and a contact hole 122b reaching the impurity diffusion layer 104 and a contact hole 122c reaching the word line 103 in the first to third interlayer insulating films 105, 108, and 115. Thereafter, as shown in FIG. 11, an upper-layer interconnect 116, a plate connection electrode 117, a diffusion-layer connection electrode 118, and a word-line connection electrode 119 are formed in the respective contact holes 122a to 122c.

The conventional semiconductor memory device fabricated through the above process steps is constructed as shown in FIG. 11. To be more specific, over the substrate 101, the word line 104, the bit line 107, the capacitor 114, and the upper-layer interconnect 116 are vertically stacked from bottom to top with the first to third interlayer insulating films 105, 108, and 115 interposed between the respective components, and the diffusion-layer connection electrode 118 and the word-line connection electrode 119 extend in vertical alignment with each other with the first to third interlayer insulating films 105, 108, and 115 interposed therebetween. Note that since the bit line 107 and the capacitor 114 are typically arranged at three-dimensionally displaced positions from each other, the bit line 107 and the capacitor 114, both of which also include associated contact portions with the substrate 101, do not exist in the same cross section in the actual device. However, for convenience in description, they are shown in the same cross section in FIG. 11.

SUMMARY OF THE INVENTION

The above-mentioned semiconductor memory device and its fabrication method according to the conventional example have the following two problems.

A first problem will now be described.

In a semiconductor memory device having a COB (Capacitor Over Bitline) structure in which a capacitor is formed over a bit line, components of a memory cell such as a gate electrode (a word line), a bit line, and a capacitor are vertically stacked. Thus, differences in surface level tend to be widened intrinsically. This creates a big problem in forming in an interlayer insulating film a contact hole for bringing an upper-layer interconnect into contact with a corresponding component. To be more specific, a contact hole for bringing an interconnect into contact with the bit line (not shown), the contact hole 122b (see FIG. 10C), and the contact hole 122c (see FIG. 10C) differ greatly in depth. In addition to this, an increase in the height of a capacitor structure widens the surface level differences. In order to compensate for the widened differences, the total thickness of the first to third interlayer insulating films 105, 108, and 115 is increased. Thereby, the contact hole formed in a portion of the first to third interlayer insulating films 105, 108, and 115 having a larger total thickness has extremely increased depth and aspect ratio. As a result, when the contact hole with a high aspect ratio is filled with a conductive layer, gas going out of the interlayer insulating films would cause an extreme decrease in the hole-filling capability or even stop of the filling. This facilitates creating a void within a conductive plug made by filling the contact hole for the bit line (not shown), the contact hole 122b, and the contact hole 122c, which in turn causes contact-resistance rise or interconnect breaks.

Next, a second problem will be described.

With high degree of integration of a semiconductor device, the semiconductor memory device with the COB structure mentioned above has the problem: oxygen that is essential in device-fabrication steps oxidizes a contact plug to raise contact resistance. Hereinafter, this problem will be concretely described with reference to FIGS. 12A and 12B. Note that FIGS. 12A and 12B are views for explaining this problem using the step in FIG. 10A as an example.

When the capacitor 114 is formed on the storage node contact 110, oxygen annealing is required for crystallization of the capacitor insulating film 112 made of a high dielectric film or a ferroelectric film. As shown in FIG. 12A, during this annealing, oxygen gas diffuses from above into the bit line contact 106 and the storage node contact 110, thereby causing poor contact resistance. Further, as shown in FIG. 12B, hydrogen gas occurring in fabrication steps after formation of the capacitor 114 diffuses from above or below the capacitor 114 into the capacitor insulating film 112 made of a high dielectric film or a ferroelectric film, which degrades capacitor properties. As is apparent from the above, the conventional semiconductor memory device suffers contact-resistance rise or interconnect breaks resulting from oxygen diffusion, or capacitor-properties degradation resulting from hydrogen gas, so that it is difficult to attain excellent device properties.

With the foregoing in mind, an object of the present invention is to provide a semiconductor memory device which is designed to have an interlayer insulating film of a relatively great thickness and concurrently to be able to suppress a rise in contact-resistance or the occurrence of interconnect breaks, and to provide a fabrication method of such a device.

In addition to this, an object of the present invention is to provide a semiconductor memory device which is designed to be able to suppress degradation of capacitor properties resulting from hydrogen gas, and to provide a fabrication method of such a device.

A semiconductor memory device according to one aspect of the present invention comprises: a first interlayer insulating film formed on a semiconductor substrate; a capacitor formed above the first interlayer insulating film and composed of a lower electrode, a capacitor insulating film of a high dielectric film or a ferroelectric film, and an upper electrode; a second interlayer insulating film formed over the first interlayer insulating film to cover the capacitor; a first contact plug formed in the first interlayer insulating film to penetrate the first interlayer insulating film; and a second contact plug formed in the second interlayer insulating film to penetrate the second interlayer insulating film to make connection to the first contact plug. In this device, between the first and second contact plugs, a first oxygen barrier film is interposed to come into contact with part of the boundary area between the first and second interlayer insulating films.

With the semiconductor memory device according to one aspect of the present invention, even in the case where the second interlayer insulating film covering the capacitor is thick, the height of the second contact plug is almost the same as the thickness of the second interlayer insulating film. Therefore, in forming the second contact plug, it is sufficient to form the second contact hole with a depth corresponding to the thickness of the second interlayer insulating film, and unlike the conventional example, it is unnecessary to form a contact plug in an opening having a depth corresponding to the total thickness of the first and second interlayer insulating films. This suppresses the occurrence of a void in forming the second contact plug, which prevents the rise in contact resistance or the occurrence of interconnect breaks resulting from poor hole-filling. In particular, if the capacitor is a three-dimensional structure, the second interlayer insulating film covering the capacitor inevitably becomes thick. Even in such a case, the semiconductor memory device according to one aspect of the present invention is more effective.

Furthermore, the oxygen barrier film is formed between the first and second contact plugs, and the oxygen barrier film is formed to come into contact with at least part of the boundary area between the first and second interlayer insulating films. With this structure, during high-temperature oxygen annealing necessary for crystallization of the high dielectric film or the ferroelectric film in formation of the capacitor insulating film subsequent to formation of the first interlayer insulating film, oxygen can be hindered from entering the first contact plug, so that the surface of the first contact plug can be prevented from being oxidized. Consequently, the rise in contact resistance or the occurrence of interconnect breaks resulting from oxygen diffusion can be prevented.

Preferably, in the semiconductor memory device according to one aspect of the present invention, the first oxygen barrier film has the hydrogen barrier property, the device further comprises a first hydrogen barrier film formed between the first and second interlayer insulating films and between the first interlayer insulating film and the capacitor, and the first oxygen barrier film is formed to penetrate the first hydrogen barrier film. More preferably, the first hydrogen barrier film is made of $SiN_x$ that is an insulating material.

With this device, the layers under the capacitor are covered with the first oxygen barrier film and the first hydrogen barrier film having the hydrogen barrier property, which hinders entry of hydrogen from below the capacitor into the capacitor. Therefore, the capacitor insulating film of a high dielectric film or a ferroelectric film can be prevented from being reduced by hydrogen generated in fabrication steps, so that degradation of properties of the capacitor can be avoided. Moreover, by employing the structure in which the entire boundary area between the first and second interlayer insulating films and between the first interlayer insulating film and the capacitor is formed with the first hydrogen barrier film, the layers under the capacitor are fully covered with the hydrogen-barrier material. Therefore, degradation of properties of the capacitor can be completely avoided.

Preferably, the semiconductor memory device according to one aspect of the present invention further comprises a second hydrogen barrier film of insulation formed to cover the capacitor and to come into contact with the first hydrogen barrier film.

With this device, since the second hydrogen barrier film is formed to fully cover the capacitor and to come into contact with the first hydrogen barrier film, the capacitor is completely covered with the first and second hydrogen barrier films. Thus, the capacitor insulating film of a high dielectric film or a ferroelectric film can be prevented from being reduced by hydrogen generated in fabrication steps, so that degradation of properties of the capacitor can be completely avoided.

Preferably, in the semiconductor memory device according to one aspect of the present invention, the first oxygen barrier film has a diameter greater than those of the first and second contact plugs.

With this device, when the second contact plug is formed to make electrical connection to the first contact plug, the flexibility of the formation position of the second contact plug is enhanced. This suppresses the occurrence of poor connection between the first and second contact plugs. Moreover, with this device, even in the case where the packing density of a semiconductor device has advanced to a high degree, fabrication of a semiconductor memory device with a high packing density can be facilitated.

Preferably, the semiconductor memory device according to one aspect of the present invention further comprises a third contact plug formed in the first interlayer insulating film to penetrate the first interlayer insulating film, and a second oxygen barrier film is interposed between the third contact plug and the capacitor.

With this device, during high-temperature oxygen annealing necessary for crystallization of the high dielectric film or the ferroelectric film in formation of the capacitor insulating film, oxygen can be hindered from entering the third contact plug, so that the surface of the third contact plug can be prevented from being oxidized. Consequently, the rise in contact resistance or the occurrence of interconnect breaks resulting from oxygen diffusion can be prevented.

Preferably, in the semiconductor memory device according to one aspect of the present invention, the second oxygen barrier film has the hydrogen barrier property.

With this device, in the structure in which the third contact plug is formed below the capacitor, the area of the device under the capacitor is fully covered with the material having the hydrogen barrier property. Therefore, degradation of properties of the capacitor can be completely avoided.

Preferably, in the semiconductor memory device according to one aspect of the present invention, at least one of the first and second oxygen barrier films is made of one or more materials selected from the group consisting of Ir, $IrO_x$, TiAlN, TiAl, TiSiN, TaN, TaSiN, TaAlN, and TaAl. More preferably, the first and second oxygen barrier films are made of the same material so that these films are formed simultaneously.

By employing such a material, during high-temperature oxygen annealing necessary for crystallization of the high dielectric film or the ferroelectric film, oxygen can be adequately prevented from entering the contact plugs, and in addition hydrogen can be adequately prevented from diffusing from below into the capacitor insulating film.

A method for fabricating a semiconductor memory device according to one aspect of the present invention comprises the steps of: forming a first opening and a second opening in a first interlayer insulating film formed on a semiconductor substrate, the first and second openings penetrating the first interlayer insulating film to reach the semiconductor substrate, respectively; forming a first contact plug in the first opening and a second contact plug in the second opening, the first and second contact plugs making electrical connection to the semiconductor substrate, respectively; forming a first hydrogen barrier film on the first interlayer insulating film, the first contact plug, and the second contact plug; forming a third opening and a fourth opening in the first hydrogen barrier film, the third opening exposing the first contact plug, the fourth opening exposing the second contact plug; forming a first oxygen barrier film in the third opening and a second oxygen barrier film in the fourth opening, the first oxygen barrier film making electrical connection to the first contact plug, the second oxygen barrier film making electrical connection to the second contact plug; forming a capacitor above the second oxygen barrier film, the capacitor being composed of a lower electrode, a capacitor insulating film of a high dielectric film or a ferroelectric film, and an upper electrode; forming a second interlayer insulating film over the first interlayer insulating film to cover the capacitor; forming a fifth opening in the second interlayer insulating film, the fifth opening exposing the first oxygen barrier film; and forming a third contact plug in the fifth opening, the third contact plug making electrical connection to the first oxygen barrier film.

With the method for fabricating a semiconductor memory device according to one aspect of the present invention, even in the case where the second interlayer insulating film covering the capacitor is thick, it is sufficient, in forming the third contact plug, to form the third contact hole with a depth corresponding to the thickness of the second interlayer insulating film. Also, unlike the conventional example, it is unnecessary to form a contact plug in an opening having a depth corresponding to the total thickness of the first and second interlayer insulating films. This suppresses the occurrence of a void in forming the third contact plug, which prevents the rise in contact resistance or the occurrence of interconnect breaks resulting from poor hole-filling.

Furthermore, the oxygen barrier film is formed between the first and third contact plugs. With this structure, during high-temperature oxygen annealing necessary for crystallization of the high dielectric film or the ferroelectric film in formation of the capacitor insulating film subsequent to formation of the first interlayer insulating film, oxygen can be hindered from entering the first contact plug, so that the surfaces of the first and second contact plugs can be prevented from being oxidized. Consequently, the rise in contact resistance or the occurrence of interconnect breaks resulting from oxygen diffusion can be prevented.

Moreover, since the first and second oxygen barrier films are formed in the same step, simplification of fabrication steps can be accomplished.

Furthermore, the first hydrogen barrier film is formed under the capacitor, which hinders entry of hydrogen from below the capacitor into the capacitor. Therefore, the capacitor insulating film of a high dielectric film or a ferroelectric film can be prevented from being reduced by hydrogen generated in fabrication steps, so that degradation of properties of the capacitor can be avoided. Moreover, by employing the first and second oxygen barrier films with the hydrogen barrier property, degradation of properties of the capacitor can be avoided more effectively.

Preferably, in the method for fabricating a semiconductor memory device according to one aspect of the present invention, the third opening has a diameter greater than those of the first opening and the fifth opening.

With this method, when the third contact plug is formed to make electrical connection to the first contact plug, the flexibility of the formation position of the third contact plug is enhanced. This suppresses the occurrence of poor connection between the first and third contact plugs. Particularly in the case where the packing density of a semiconductor device advances to a high degree to decrease the diameter of at least one of the first and third contact plugs to an extremely small value, an adequate alignment margin of the fifth opening with respect to the first opening can be provided. Therefore, fabrication of a semiconductor memory device with a high packing density can be facilitated.

BRIEF DESCRIPTION OF THE DRAWINGS

FIG. 1A is a plan view showing main parts of this structure, and FIG. 1B is a sectional view showing main parts thereof taken along the line Ib-Ib in FIG. 1A.

FIG. 7A is a plan view showing main parts of this structure, and FIG. 7B is a sectional view showing main parts thereof taken along the line VIIb-VIIb in FIG. 7A.

DETAILED DESCRIPTION OF THE PREFERRED EMBODIMENTS

First Embodiment

Hereinafter, a semiconductor memory device according to a first embodiment of the present invention will be described with reference to the accompanying drawings.

Figure 1A:
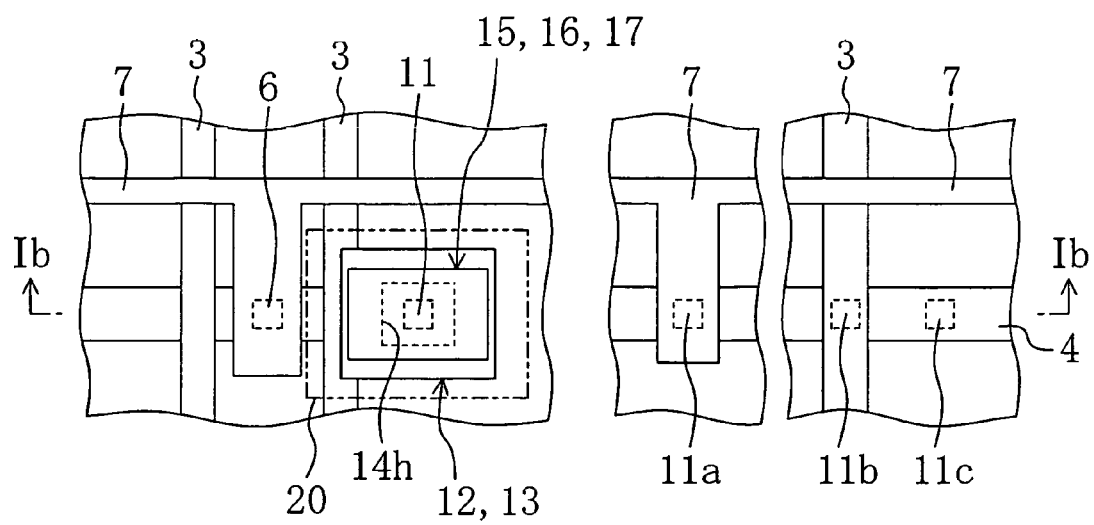
FIGS. 1A and 1B are views showing the structure of a semiconductor memory device according to a first embodiment of the present invention.
Figure 1B:
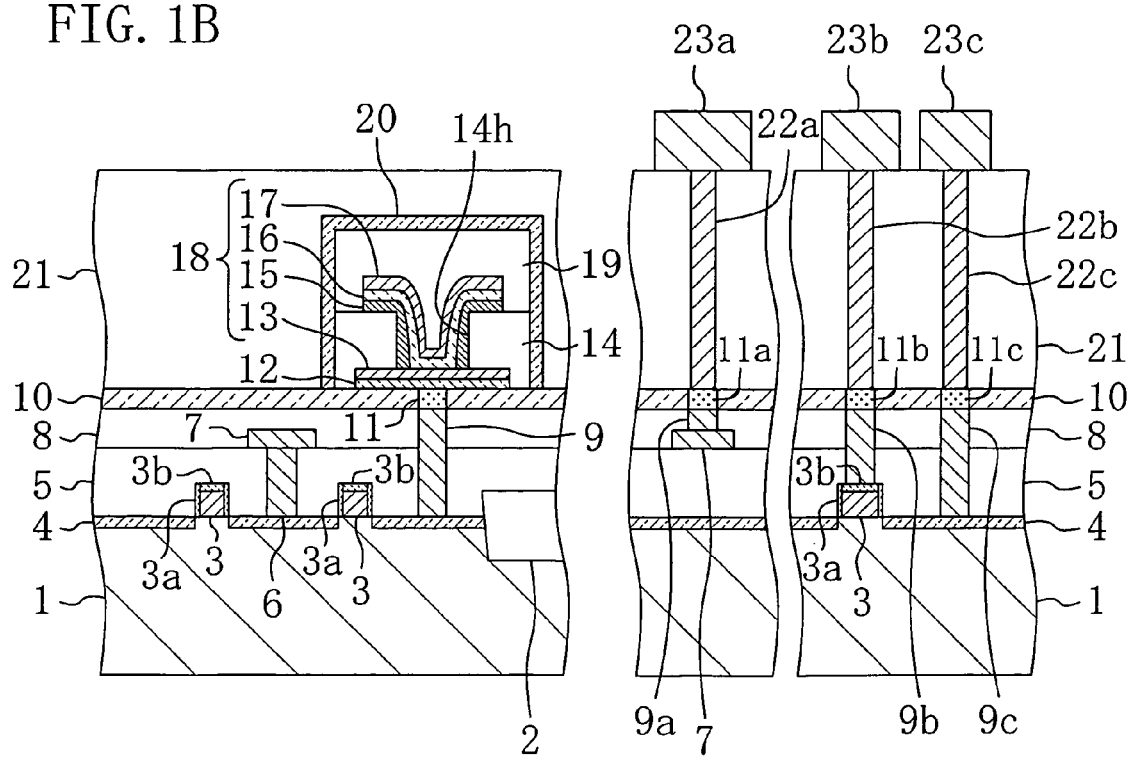

FIGS. 1A and 1B are views showing the structure of the semiconductor memory device according to the first embodiment of the present invention. FIG. 1A is a plan view showing main parts of this structure, and FIG. 1B is a sectional view showing main parts thereof taken along the line Ib-Ib in FIG. 1A.

Referring to FIGS. 1A and 1B, a gate electrode 3 is formed in an element formation region defined by an isolation region (STI: shallow trench isolation) 2 in a semiconductor substrate 1. In the surface portion of the element formation region, doped layers 4 are formed to interpose the gate electrode 3. Thus, the doped layers 4 and the gate electrode 3 constitute a transistor. Side-wall insulating films 3a are formed on side surfaces of the gate electrode 3, and a silicide layer 3b is formed on a top surface of the gate electrode 3.

Over the entire surface of the semiconductor substrate 1, a first interlayer insulating film 5 is formed to cover the transistor. Through the first interlayer insulating film 5, a first contact plug 6 of tungsten or polysilicon is formed to connect the lower end thereof to the doped layer 4. On the first interlayer insulating film 5, a bit line 7 is formed to connect the lower surface thereof to the upper end of the first contact plug 6. Also, on the first interlayer insulating film 5, a second interlayer insulating film 8 is formed to cover the bit line 7. Through the first and second interlayer insulating films 5 and 8, a second contact plug 9 of tungsten or polysilicon is formed to connect the lower end thereof to the doped layer 4. In the second interlayer insulating film 8, a second contact plug 9a is formed to connect the lower end thereof to the top surface of the bit line 7. In the first and second interlayer insulating films 5 and 8, a second contact plug 9b is formed to connect the lower end thereof to the top portion of the gate electrode 3, and concurrently a second contact plug 9c is formed to connect the lower end thereof to the doped layer 4.

A first hydrogen barrier film 10 of, for example, a silicon nitride film is formed on the second interlayer insulating film 8 and the second contact plugs 9, 9a, 9b, and 9c. Third contact plugs 11, 11a, 11b, and 11c are formed through the first hydrogen barrier film 10. The lower end of the third contact plug 11 is connected to the upper end of the second contact plug 9, the lower end of the third contact plug 11a is connected to the upper end of the second contact plug 9a, the lower end of the third contact plug 11b is connected to the upper end of the second contact plug 9b, and the lower end of the third contact plug 11c is connected to the upper end of the second contact plug 9c. Each of the third contact plugs 11, 11a, 11b, and 11c is made of a TiAlN film or a TiAl film which serves as an oxygen barrier film and also as a hydrogen barrier film. As the material for the third contact plugs 11, 11a, 11b, and 11c, use can be made of, other than a TiAlN film or a TiAl film, one or more materials selected from the group consisting of an Ir film, an $IrO_x$ film, a TiSiN film, a TaN film, a TaSiN film, a TaAlN film, and a TaAl film.

Note that the first contact plug 6 is a bit line interconnect contact and the second contact plug 9 is a storage node contact. The second contact plug 9a provided away from the region formed with a capacitor 18 that will be described later is a bit line contact, and electrically connected to the first contact plug 6. The second contact plug 9b is a word line contact and electrically connected to the gate electrode 3 in the region formed with the capacitor 18. The second contact plug 9c is a diffusion layer contact. The third contact plugs 11a, 11b, and 11c of the same material as the third contact plug 11 are connected to the bit line interconnect contact, the word line contact, and the diffusion layer contact, respectively.

On the first hydrogen barrier film 10, an oxygen barrier film 12 of a TiAlN film exhibiting conductivity and a first lower electrode 13 of a Pt film are stacked in this order. The oxygen barrier film 12 is patterned to connect the lower surface thereof to the upper end of the third contact plug 11. The oxygen barrier film 12 is made of a TiAlN film having a thickness of 40 to 150 nm, and the first lower electrode 13 is made of a Pt film having a thickness of 50 to 100 nm. On the first hydrogen barrier film 10, a third interlayer insulating film 14 with an opening 14h is formed to cover the oxygen barrier film 12 and the first lower electrode 13. The opening 14h exposes the first lower electrode 13.

A second lower electrode 15 in a cylindrical shape is formed on an inner wall of the opening 14h, part of the bottom of the opening 14h, and the third interlayer insulating film 14. On part of the bottom of the opening 14h and on the second lower electrode 15, a capacitor insulating film 16 is formed which is made of a high dielectric film or a ferroelectric film (for example, $SrBi_2(Ta_{1-x}Nb_x)O_9$). An upper electrode 17 of a Pt film is formed on the capacitor insulating film 16. The capacitor insulating film 16 has a thickness of 50 to 150 nm, and the upper electrode 17 has a thickness of 50 to 100 nm. Thus, the first and second lower electrodes 13 and 15, the capacitor insulating film 16, and the upper electrode 17 constitute a capacitor 18.

On the third interlayer insulating film 14, a fourth interlayer insulating film 19 is formed to cover the capacitor 18. The fourth interlayer insulating film 19 is provided for the purpose of electrically isolating adjacent capacitors 18 (not shown). A second hydrogen barrier film 20 of an aluminum oxide film (whose thickness is 5 to 100 nm) is formed to come into contact with the side surface of the third interlayer insulating film 14 and the upper and side surfaces of the fourth interlayer insulating film 19. In this structure, the second hydrogen barrier film 20 is in contact with the top surface of the first hydrogen barrier film 10. On the first hydrogen barrier film 10, a fifth interlayer insulating film 21 of a $SiO_2$ film is formed to cover the capacitor 18.

In a region of the fifth interlayer insulating film 21 away from the area formed with the capacitor 18, fourth contact plugs 22a, 22b, and 22c of tungsten or polysilicon are formed through the fifth interlayer insulating film 21 to connect the lower ends thereof to the upper ends of the third contact plugs 11a, 11b, and 11c, respectively. On the fifth interlayer insulating film 21, interconnect layers 23a, 23b, and 23c are formed to connect the lower surfaces thereof to the upper ends of the fourth contact plugs 22a, 22b, and 22c, respectively.

A method for fabricating a semiconductor memory device according to the first embodiment of the present invention will be described below.

FIGS. 2A to 2C, FIGS. 3A to 3C, and FIGS. 4A and 4B are sectional views showing main process steps of the method for fabricating a semiconductor memory device according to the first embodiment of the present invention, which are taken along the line Ib-Ib in FIG. 1A.

Figure 2A:
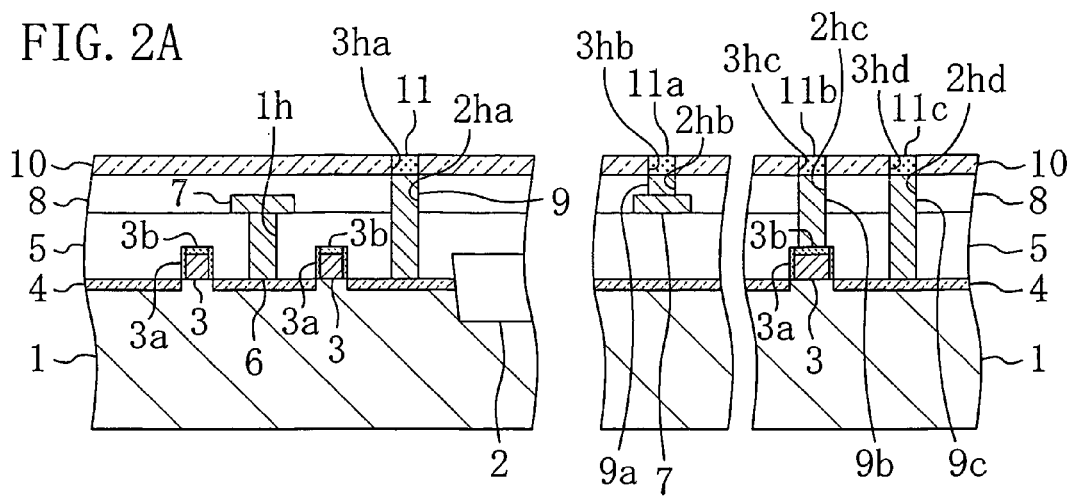
FIGS. 2A to 2C are sectional views showing main process steps of a method for fabricating a semiconductor memory device according to the first embodiment of the present invention.

First, as shown in FIG. 2A, the gate electrode 3 is formed in the element formation region defined by the isolation region (STI) 2 in the semiconductor substrate 1. Thereafter, ion implantation using the gate electrode 3 as a mask is performed to form the doped layers 4 in the surface portion of the element formation region. This allows integration of transistors each made of the doped layers 4 and the gate electrode 3. As illustrated in this figure, the side surfaces of the gate electrode 3 are formed with the side-wall insulating films 3a, respectively, and the top surface thereof is formed with the silicide layer 3b.

Subsequently, over the entire surface of the semiconductor substrate 1, the first interlayer insulating film 5 of an ozone-based silicon dioxide ($SiO_2$) film having a thickness of 300 to 1000 nm is formed to cover the transistor, and the surface of the formed film is planarized by a CMP method or the like. By dry etching, a first contact hole 1h (note that the diameter thereof is 0.22 to 0.24 μm.) reaching the doped layer 4 is formed through the first interlayer insulating film 5, and then by either a combination of a CVD method and an etch back method or a combination of a CVD method and a CMP method, the first contact hole 1h is filled with tungsten or polysilicon to form the first contact plug 6. Thereafter, on the first interlayer insulating film 5 and the first contact plug 6, the bit line 7 of tungsten is formed to connect the lower surface thereof to the upper end of the first contact plug 6. On the entire surface of the first interlayer insulating film 5, the second interlayer insulating film 8 of an ozone-based silicon dioxide ($SiO_2$) film having a thickness of 1000 to 1500 nm is formed to cover the bit line 7, and the surface of the formed film is planarized by a CMP method or the like.

Next, by a dry etching method, a second contact hole 2ha reaching the doped layer 4 is formed in the first and second interlayer insulating films 5 and 8, a second contact hole 2hb reaching the bit line 7 is formed in the second interlayer insulating film 8, a second contact hole 2hc reaching the gate electrode 3 is formed in the first and second interlayer insulating films 5 and 8, and a second contact hole 2hd reaching the doped layer 4 is formed in the first and second interlayer insulating films 5 and 8 (note that the diameters of the second contact holes 2ha to 2hd are 0.22 to 0.24 μm). Thereafter, by either a combination of a CVD method and an etch back method or a combination of a CVD method and a CMP method, the second contact holes 2ha to 2hd are filled with tungsten or polysilicon to form the second contact plugs 9, 9a, 9b and 9c, respectively.

On the entire surfaces on the second contact plugs 9, 9a, 9b, and 9c and the second interlayer insulating film 8, the first hydrogen barrier film 10 of a silicon nitride (SiN) film is deposited to have a thickness of about 20 to 100 nm. In this step, it is recommended that the silicon nitride (SiN) film deposition is performed using, for example, a low-pressure CVD method. Then, by a dry etching method, third contact holes 3ha to 3hd (note that the diameters thereof are 0.22 to 0.24 μm.) exposing the surfaces of the second contact plugs 9, 9a, 9b, and 9c, respectively, are formed in the first hydrogen barrier film 10. Thereafter, by either a combination of a CVD method and an etch back method or a combination of a CVD method and a CMP method, the third contact holes 3ha to 3hd are filled with a TiAlN film or a TiAl film (the thicknesses thereof are about 100 to 150 nm) to form the third contact plugs 11, 11a, 11b, and 11c (about 100 to 150 nm), respectively. As the material for the third contact plugs 11, 11a, 11b, and 11c, use can be made of, other than a TiAlN film or a TiAl film, one or more materials selected from the group consisting of an Ir film, an $IrO_x$ film, a TiSiN film, a TaN film, a TaSiN film, a TaAlN film, and a TaAl film.

Figure 2B:
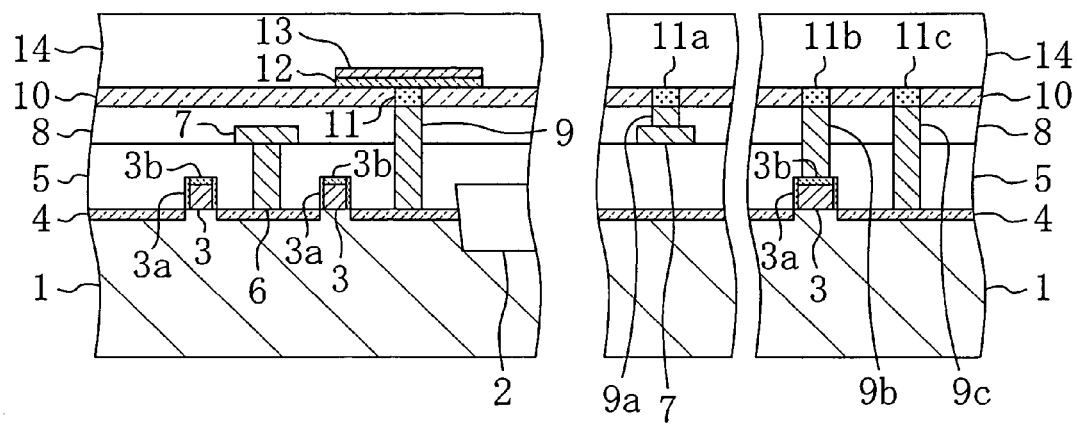

As shown in FIG. 2B, on the third contact plugs 11, 11a, 11b, and 11c and the first hydrogen barrier film 10, a stacked film made by stacking a TiAlN film and a Pt film in this order from bottom is formed by a sputtering method, and the stacked film is patterned by a dry etching method to form the oxygen barrier film 12 of a TiAlN film and the first lower electrode 13 of a Pt film. Note that the oxygen barrier film 12 exhibits not only the oxygen barrier property but also the hydrogen barrier property. Subsequently to the formation, on the first hydrogen barrier film 10, the third interlayer insulating film 14 of, for example, a silicon dioxide ($SiO_2$) film having a thickness of about 900 to 1000 nm is deposited to cover the oxygen barrier film 12 and the first lower electrode 13, and the surface of the deposited film is planarized using a CMP method or the like.

Figure 2C:
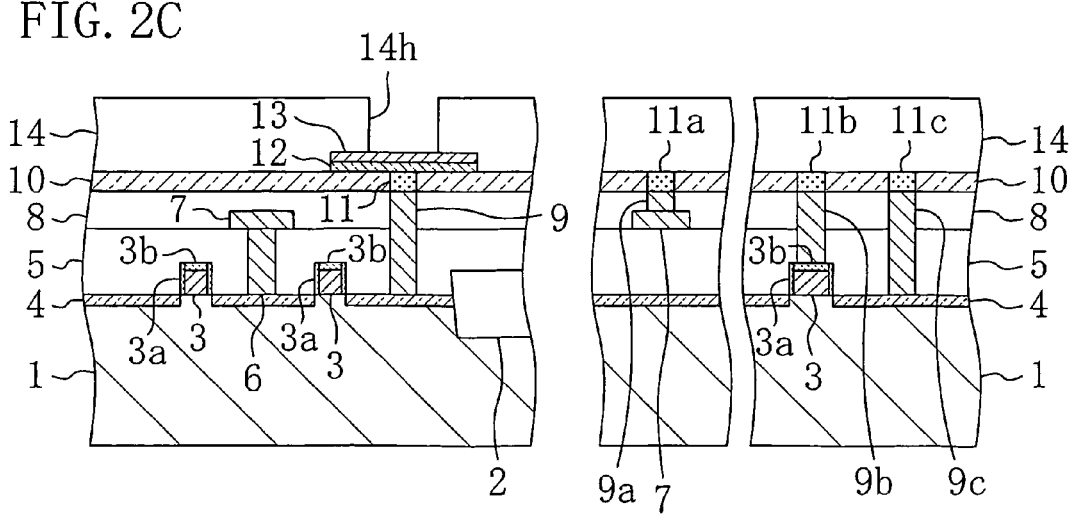

As shown in FIG. 2C, by lithography and dry etching methods, the opening 14h exposing the top surface of the first lower electrode 13 is formed through the third interlayer insulating film 14.

Figure 3A:
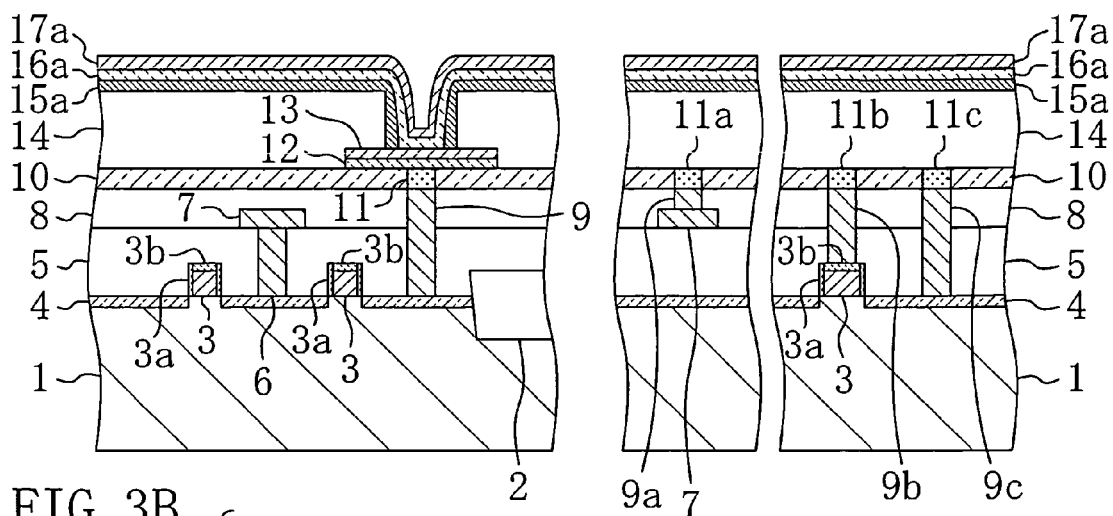
FIGS. 3A to 3C are sectional views showing main process steps of the method for fabricating a semiconductor memory device according to the first embodiment of the present invention.

Subsequently, as shown in FIG. 3A, by a sputtering method, a first platinum film 15a is formed on the third interlayer insulating film 14 including the inside of the opening 14h, and then by etch back, a portion of the first platinum film 15a located on the bottom of the opening 14h is removed to expose the top surface of the first lower electrode 13 from the bottom of the opening 14h. Thereafter, by a metal organic decomposition method (an MOD method), a metal organic chemical vapor deposition method (an MOCVD method), or a sputtering method, a dielectric film 16a of a high dielectric film or a ferroelectric film (for example, $SrBi_2(Ta_{1-x}Nb_x)O_9$ with a bismuth-layered perovskite structure) having a thickness of 150 nm is formed on a portion of the first lower electrode 13 exposed in the opening 14h and on the first platinum film 15a. Then, by a sputtering method, a second platinum film 17a is formed on the dielectric film 16a. In order to crystallize the dielectric film 16a, a thermal treatment is performed in an oxygen atmosphere at 650 to 800° C.

Figure 3B:
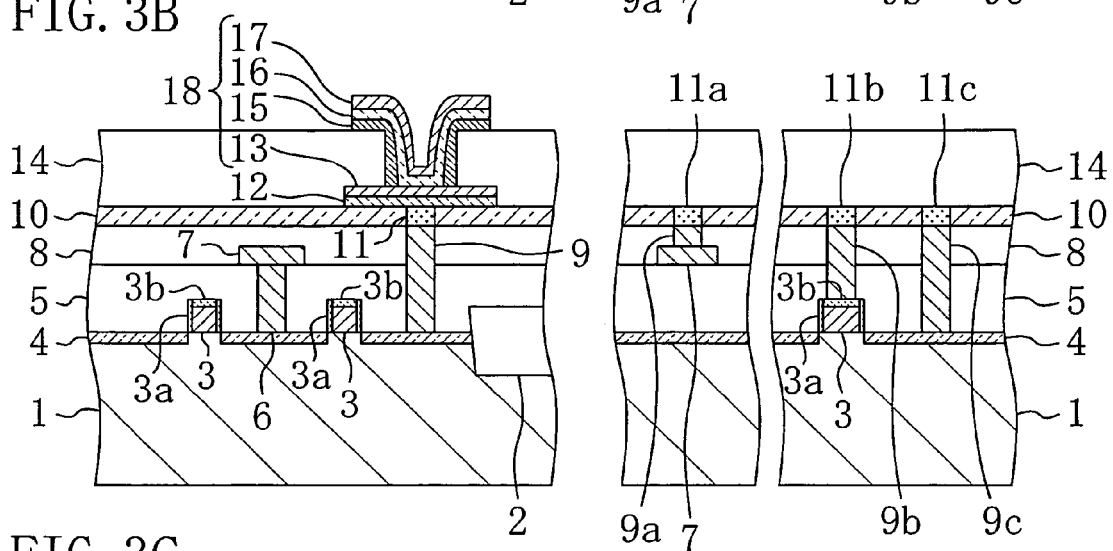

As shown in FIG. 3B, a photoresist pattern is formed on the second platinum film 17a, after which the second platinum film 17a, the dielectric film 16a, and the first platinum film 15a are patterned by a dry etching method to form the second lower electrode 15 of the first platinum film 15a, the capacitor insulating film 16 of the dielectric film 16a, and the upper electrode 17 of the second platinum film 17a. In the manner described above, the capacitor 18 is provided which is composed of the first lower electrode 13, the second lower electrode 15, the capacitor insulating film 16, and the upper electrode 17. Note that the patterning on the second platinum film 17a, the dielectric film 16a, and the first platinum film 15a is performed by lithography and etching methods with the same mask.

Figure 3C:
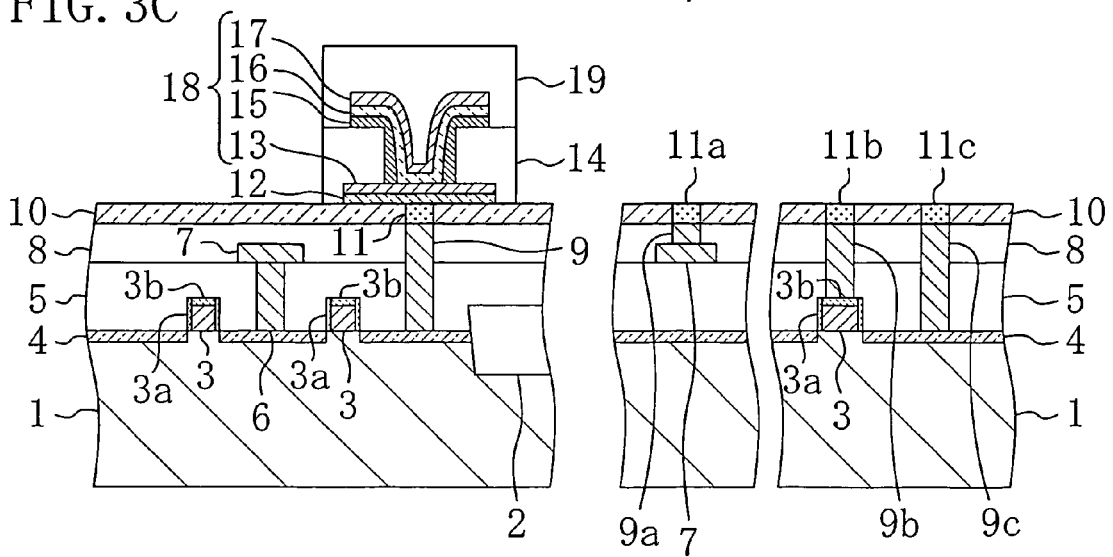

As shown in FIG. 3C, on the third interlayer insulating film 14, the fourth interlayer insulating film 19 of an ozone-based silicon dioxide ($SiO_2$) film having a thickness of 500 to 1500 nm is formed to cover a portion of the capacitor 18 located on the third interlayer insulating film 14 and exposed within the opening 14h, and then using a CMP method or the like, the surface of the formed film is planarized to such an extent that the upper electrode 17 is not exposed. By a dry etching method, the fourth interlayer insulating film 19 and the third interlayer insulating film 14 are patterned, whereby portions of the fourth and third interlayer insulating films 19 and 14 surrounding the capacitor 18 are allowed to remain and the other portions of the fourth and third interlayer insulating films 19 and 14 are removed to expose the first hydrogen barrier film 10. In this step, patterning on the fourth and third interlayer insulating films 19 and 14 is performed by lithography and etching methods with the same mask.

Figure 4A:
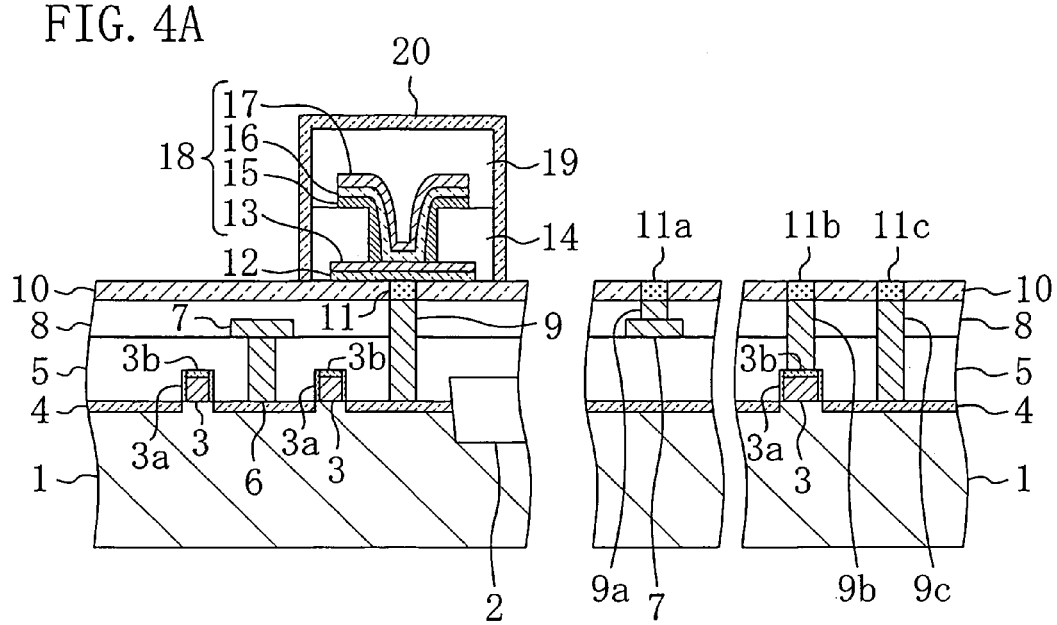
FIGS. 4A and 4B are sectional views showing main process steps of the method for fabricating a semiconductor memory device according to the first embodiment of the present invention.

Next, as shown in FIG. 4A, by a CVD method or a sputtering method, the second hydrogen barrier film 20 of an aluminum oxide film with a thickness of 5 to 100 nm is formed to fully cover the top and side surfaces of the fourth interlayer insulating film 19 and the side surface of the third interlayer insulating film 14. In this step, the second hydrogen barrier film 20 is in contact with the first hydrogen barrier film 10 of a SiN film.

Figure 4B:
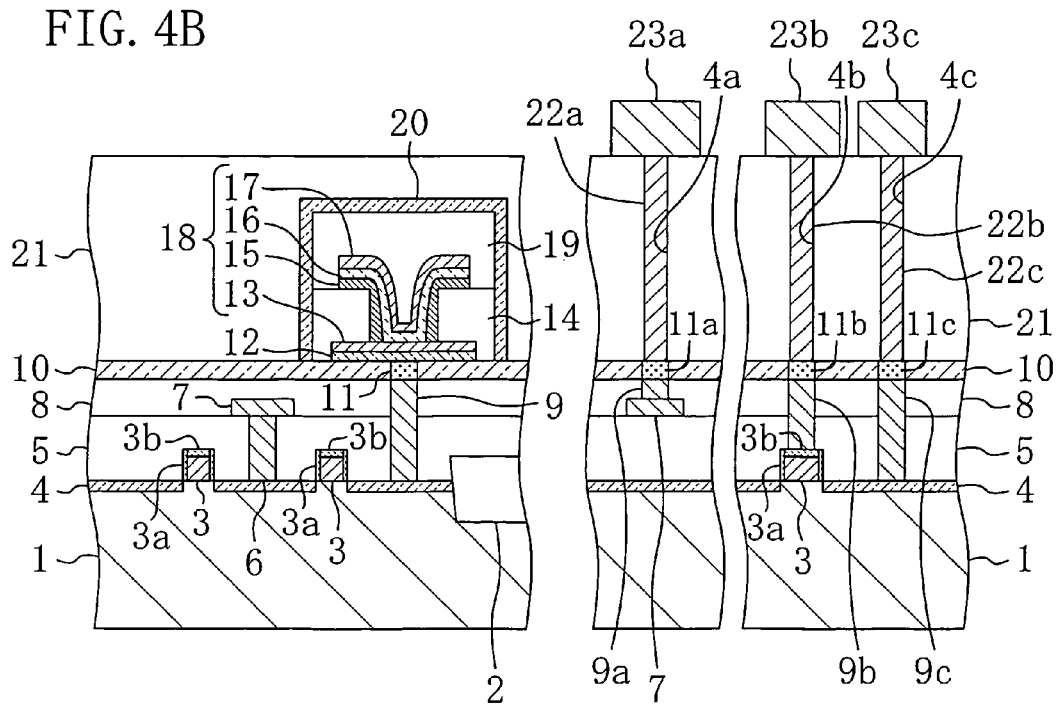

As shown in FIG. 4B, on the first hydrogen barrier film 10, the fifth interlayer insulating film 21 of an ozone-based silicon dioxide ($SiO_2$) film having a thickness of 400 to 1000 nm is formed to cover the second hydrogen barrier film 20, and the surface of the formed film is planarized using a CMP method or the like. Subsequently, by a dry etching method, through the fifth interlayer insulating film 21, fourth contact holes 4a to 4c are formed to expose the top surfaces of the third contact plugs 11a to 11c, respectively. By either a combination of a CVD method and an etch back method or a combination of a CVD method and a CMP method, the fourth contact holes 4a to 4c are filled with tungsten or polysilicon to form the fourth contact plugs 22a to 22c, respectively. Thereafter, the interconnect 23a whose bottom surface is connected to the upper end of the fourth contact plug 22a, the interconnect 23b whose bottom surface is connected to the upper end of the fourth contact plug 22b, and the interconnect 23c whose bottom surface is connected to the upper end of the fourth contact plug 22c are formed on the fourth interlayer insulating film 21.

Preferably, as shown also in FIG. 4B, the first hydrogen barrier film 10 is formed to be interposed between the second and third interlayer insulating films 5 and 18, and to be positioned not only in the region on which the capacitor 18 will be formed but also in, for example, the region under which the contact hole reaching the doped layer 4 such as a source region or a drain region is formed.

The third contact plugs 11a, 11b, and 11c of an oxygen barrier film are formed between the second contact plugs 9a, 9b, and 9c and the fourth contact plugs 22a, 22b, and 22c, respectively, and each of the oxygen barrier films is formed to come into contact with at least part of the boundary area between the second and fifth interlayer insulating films 8 and 21. With this structure, during high-temperature oxygen annealing necessary for crystallization of the high dielectric film or the ferroelectric film in formation of the capacitor insulating film 16 subsequent to formation of the second interlayer insulating film 8, oxygen can be hindered from entering the second contact plugs 9a, 9b, and 9c, so that the surfaces of the second contact plugs 9a, 9b, and 9c can be prevented from being oxidized. Consequently, the rise in contact resistance or the occurrence of interconnect breaks resulting from oxygen diffusion can be prevented.

Moreover, the third contact plugs 11a, 11b, and 11c of an oxygen barrier film have the hydrogen barrier property, and the first hydrogen barrier film 10 is provided in the entire boundary area in interposed relation between the second and fifth interlayer insulating films 8 and 21. Thus, the layers under the capacitor 18 are fully covered with the third contact plugs 11a, 11b, and 11c and the first hydrogen barrier film 10 that are made of a hydrogen-barrier material, which prevents entry of hydrogen from below the capacitor 18 into the capacitor 18. Therefore, the capacitor insulating film 16 of a high dielectric film or a ferroelectric film can be prevented from being reduced by hydrogen generated in fabrication steps, so that degradation of properties of the capacitor 18 can be avoided.

Furthermore, since the second hydrogen barrier film 20 is formed to fully cover the capacitor 18 and to come into contact with part of the top surface of the first hydrogen barrier film 10, the capacitor 18 is completely covered with the first and second hydrogen barrier films 10 and 20. Therefore, the capacitor insulating film 16 made of a high dielectric film or a ferroelectric film can be prevented from being reduced by hydrogen generated in fabrication steps, so that degradation of properties of the capacitor 18 can be avoided.

Moreover, the second contact hole 2ha provided in the portion of the first and second interlayer insulating films 5 and 8 located below the capacitor 18 is formed with the second contact plug 9 and the third contact plug 11 of an oxygen barrier film. With this structure, during high-temperature oxygen annealing necessary for crystallization of the high dielectric film or the ferroelectric film in formation of the capacitor insulating film 16, oxygen can be hindered from entering the second contact plug 9, so that the surface of the second contact plug 9 can be prevented from being oxidized. Consequently, the rise in contact resistance or the occurrence of interconnect breaks resulting from oxygen diffusion can be prevented.

Furthermore, since the third contact plugs 11, 11a, 11b, and 11c of an oxygen barrier film are formed in the same step, simplification of fabrication steps can be accomplished.

Next description will be made of the effect provided by forming the third contact plugs 11a, 11b, and 11c of an oxygen barrier film in the first embodiment.

First, evaluations of contact resistances of the second contact plugs 9a, 9b, and 9c with the fourth contact plugs 22a, 22b, and 22c and the interconnect layers 23a, 23b, and 23c will be described with reference to FIGS. 5A and 5B.

Figure 5A:
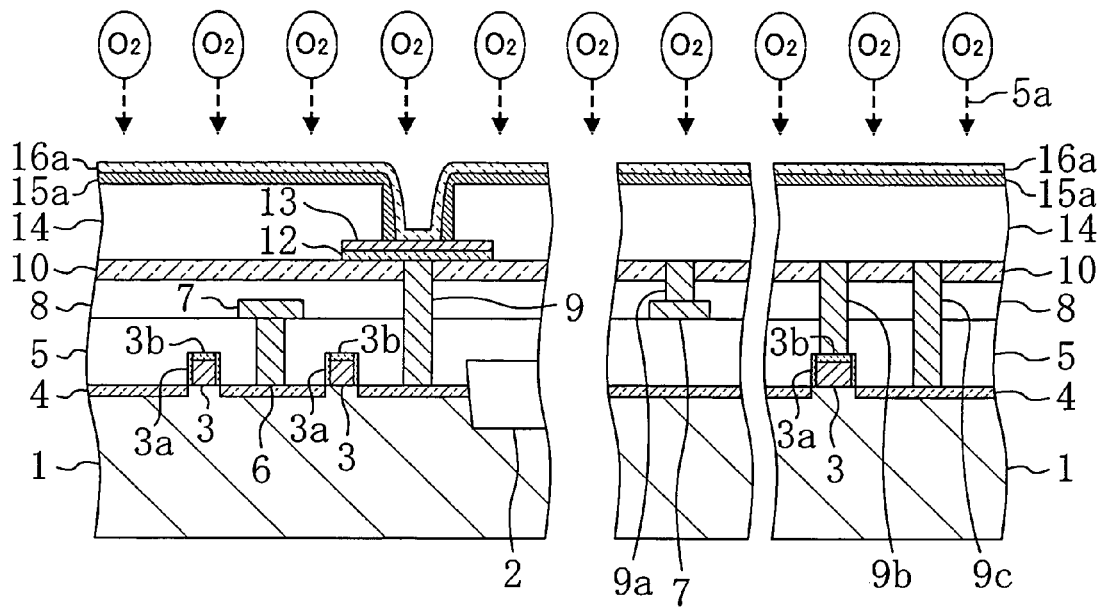
FIG. 5A is a sectional view showing main parts of a comparative semiconductor memory device for comparison with the semiconductor memory device according to the first embodiment of the present invention.

Note that in the evaluations of the contact resistances, as shown in FIG. 5A, a device in which the third contact plugs 11a, 11b, and 11c are not formed on top of the second contact plugs 9a, 9b, and 9c, respectively (the other construction is identical to that of the present invention), is employed as a comparative example with respect to the present invention.

Figure 5B:
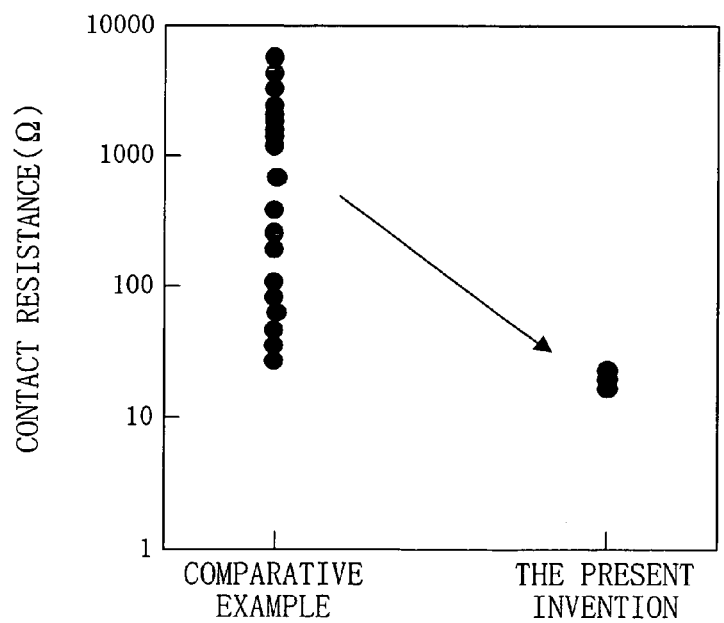
FIG. 5B is a graph showing the result of evaluating the contact resistances of the semiconductor memory devices according to the comparative example and the first embodiment of the present invention.

FIG. 5B shows the result of measuring the contact resistances of all measurement points of the devices on the surface of an 8-inch silicon wafer.

Referring to FIG. 5B, first, for the comparative example, it is found that the contact resistances vary over a range of 45 to 7000Ω. The reason for this result is as follows: as shown in FIG. 5A, during oxygen annealing necessary for crystallization of the capacitor insulating film 16 of a high dielectric film or a ferroelectric film, oxygen 5a entering from above penetrates the third interlayer insulating film 14 to diffuse even into the interfaces of the second contact plugs 9a, 9b, and 9c, whereby the surfaces of the second contact plugs 9a, 9b, and 9c are oxidized.

On the other hand, for the device of the first embodiment in which the third contact plugs 11a, 11b, and 11c of an oxygen barrier film are formed on top of the second contact plugs 9a, 9b, and 9c, respectively, the contact resistances of all measurement points on the surface of the silicon wafer fall within a range of 25 to 35Ω. From this result, it is found that the devices with very little variations and lowered resistances are fabricated.

Next description with reference to FIG. 6 will be made of the result of evaluations of anti-reduction of the semiconductor memory device according to the first embodiment.

Figure 6:
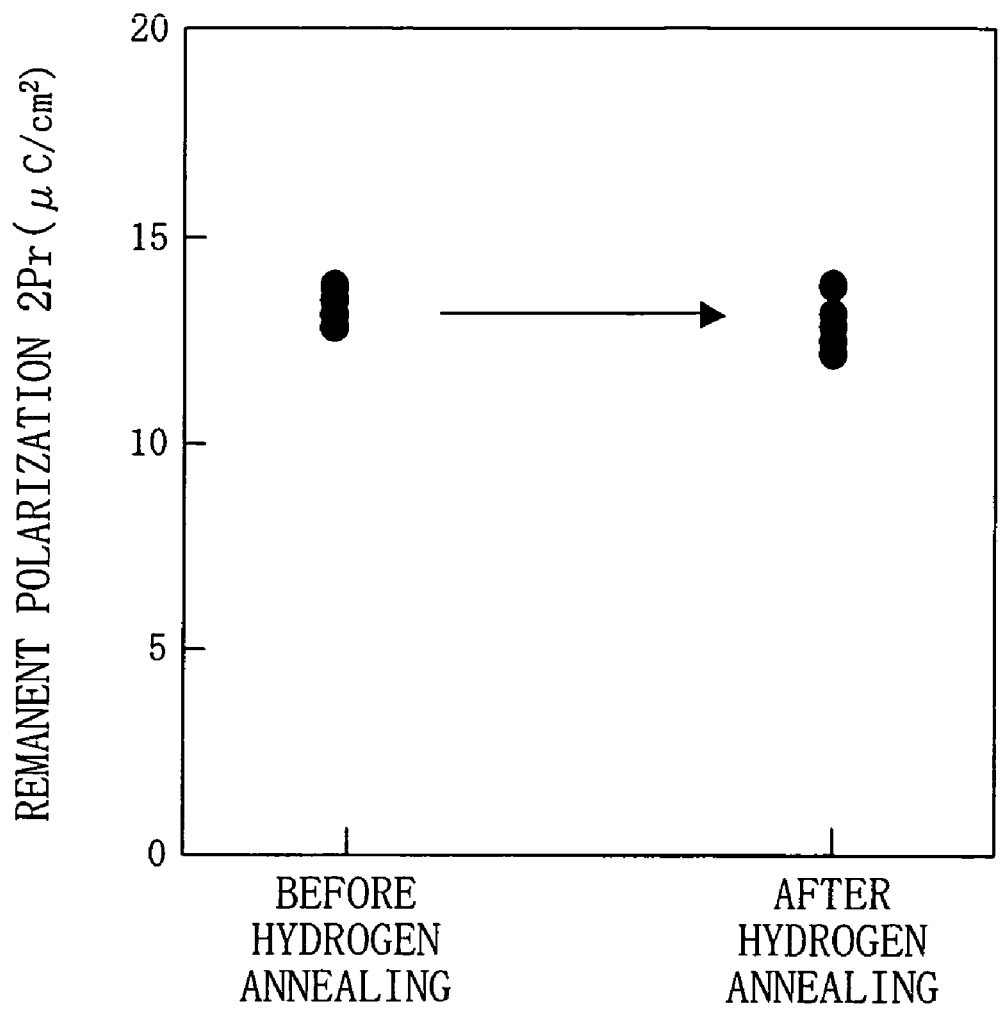
FIG. 6 is a graph showing the result of evaluating the remanent polarization (2Pr) of a capacitor before and after hydrogen annealing at 400° C. on the semiconductor memory device according to the first embodiment of the present invention.

FIG. 6 shows the result of evaluating the remanent polarization (2Pr) of the capacitor 18 before and after hydrogen annealing at 400° C.

As shown in FIG. 6, for the capacitor 18 in the first embodiment, it is found that the remanent polarization properties hardly change before and after the hydrogen annealing. This result indicates the following: in the semiconductor memory device according to the first embodiment, all the layers under the capacitor 18 are covered with a hydrogen barrier material, which prevents entry of hydrogen from below the capacitor 18 into the capacitor 18. Moreover, the capacitor 18 is fully covered with the first and second hydrogen barrier films 10 and 20, whereby the capacitor insulating film 16 made of a high dielectric film or a ferroelectric film can be prevented from being reduced by hydrogen generated in fabrication steps, so that degradation of properties of the capacitor 18 can be avoided.

Second Embodiment

A semiconductor memory device and its fabrication method according to a second embodiment of the present invention will be described below with reference to the accompanying drawings.

Figure 7A:
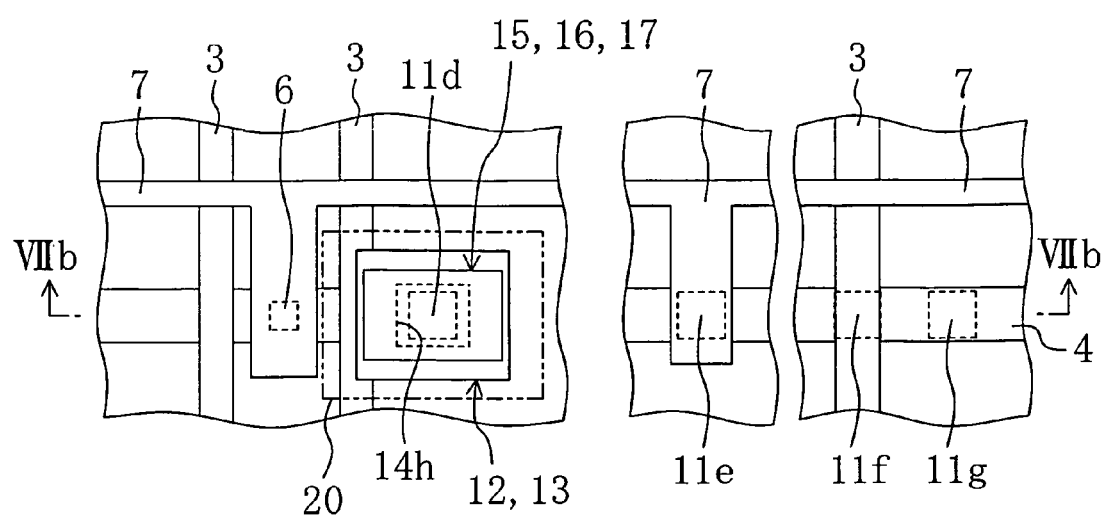
FIGS. 7A and 7B are views showing the structure of a semiconductor memory device according to a second embodiment of the present invention.
Figure 7B:
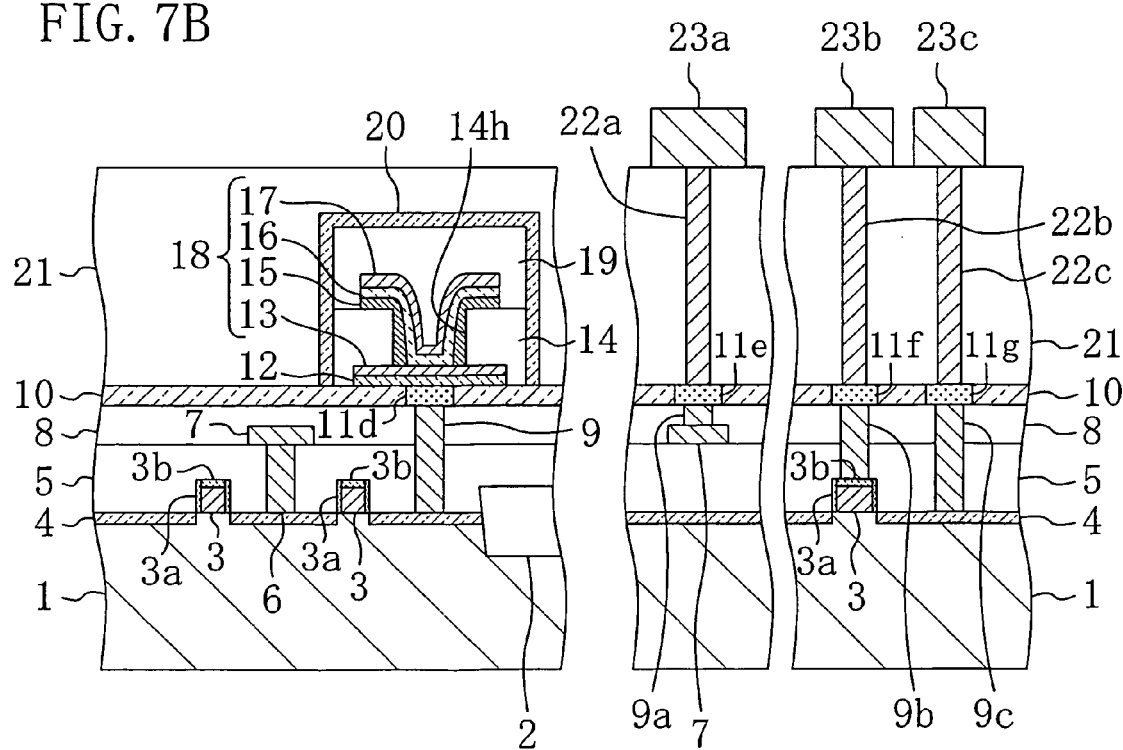

FIGS. 7A and 7B are views showing the structure of the semiconductor memory device according to the second embodiment of the present invention. FIG. 7A is a plan view showing main parts of this structure, and FIG. 7B is a sectional view showing main parts thereof taken along the line VIIb-VIIb in FIG. 7A. As seen in FIGS. 7A and 7B, when a comparison is made between the semiconductor memory device according to the second embodiment of the present invention with the above-described semiconductor memory device according to the first embodiment of the present invention, they are different in the design of the third contact plugs 11d, 11e, 11f, and 11g but they are identical in the other components. Hence, the following description will be made mainly of the different point of the design.

Referring to FIGS. 7A and 7B, the third contact plug 11e is formed to have a diameter greater than those of the second and fourth contact plugs 9a and 22a, the third contact plug 11f is formed to have a diameter greater than those of the second and fourth contact plugs 9b and 22b, and the third contact plug 11g is formed to have a diameter greater than those of the second and fourth contact plugs 9c and 22c. To be more specific, the second contact plugs 9a, 9b, and 9c and the fourth contact plugs 22a, 22b, and 22c have diameters of 0.22 to 0.24 μm, while the third contact plugs 11e, 11f, and 11g have diameters equal to or more than 0.08 g/m greater than those of the second contact plugs 9a, 9b, and 9c and the fourth contact plugs 22a, 22b, and 22c.

Furthermore, the third contact plug 11d is also formed to have a diameter equal to or more than 0.08 μm greater than that of the second contact plug 9.

A method for fabricating a semiconductor memory device according to the second embodiment of the present invention will be described below.

Figure 8A:
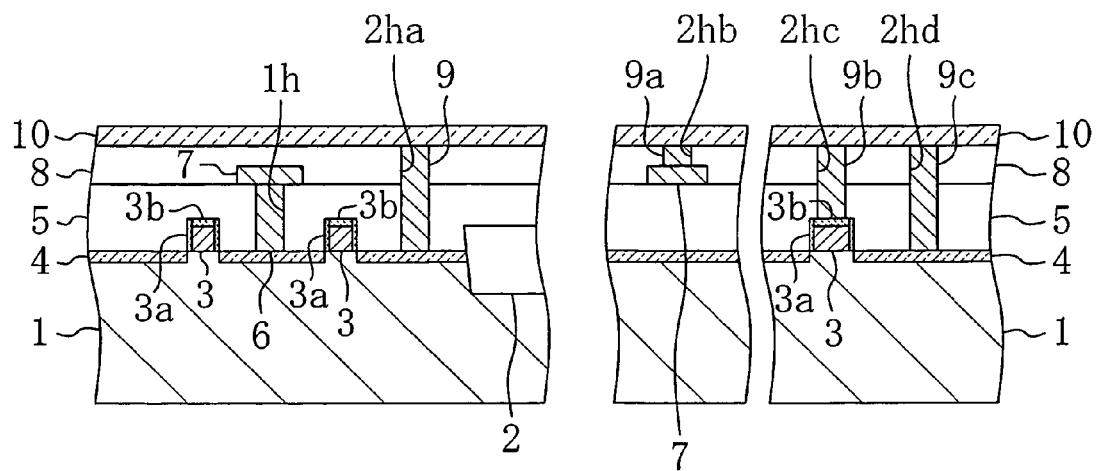
FIGS. 8A and 8B are sectional views showing main process steps of a method for fabricating a semiconductor memory device according to the second embodiment of the present invention.
Figure 8B:
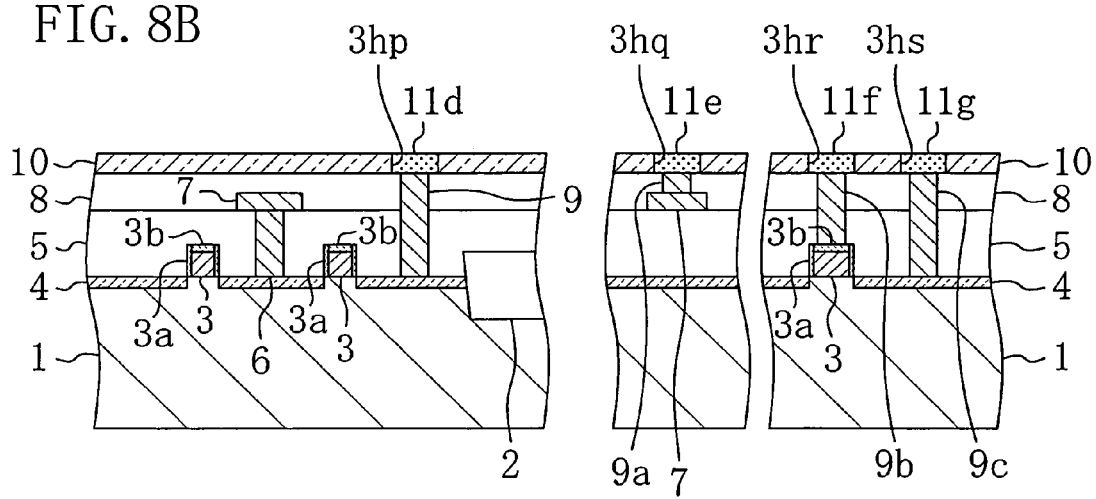
Figure 9A:
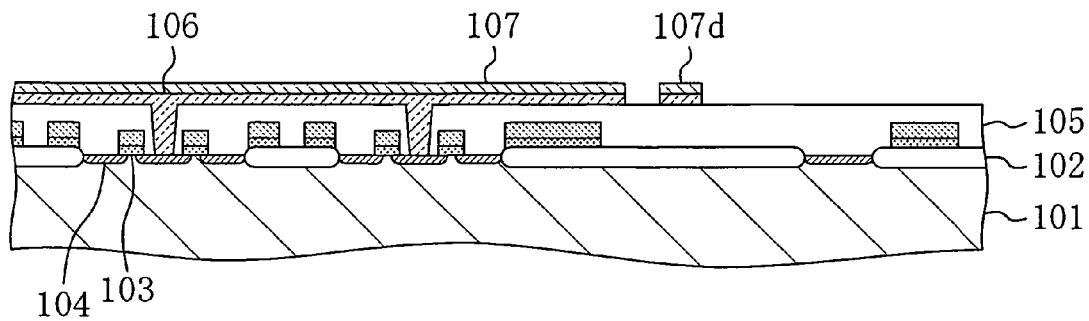
FIGS. 9A to 9C are sectional views showing main parts of the structure of a semiconductor memory device according to a conventional example.
Figure 9B:
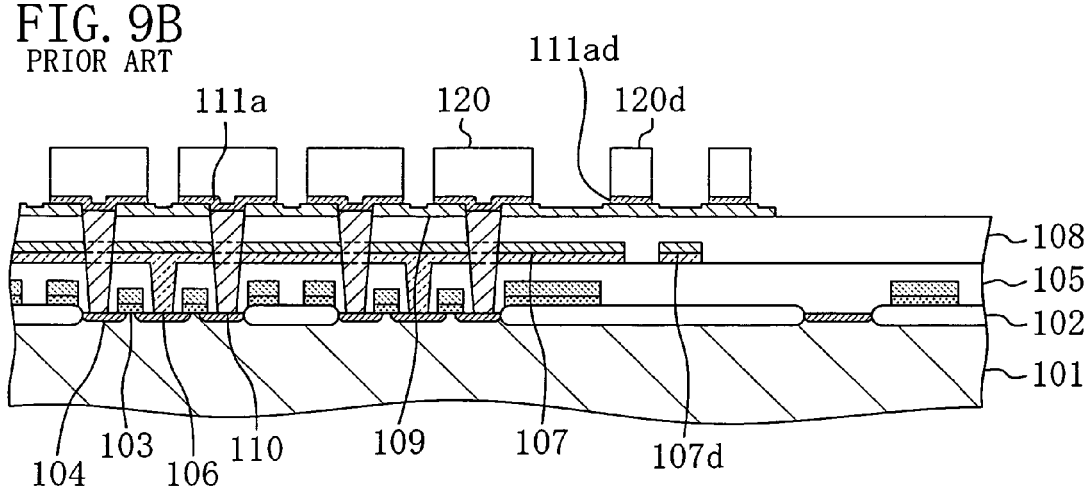
Figure 9C:
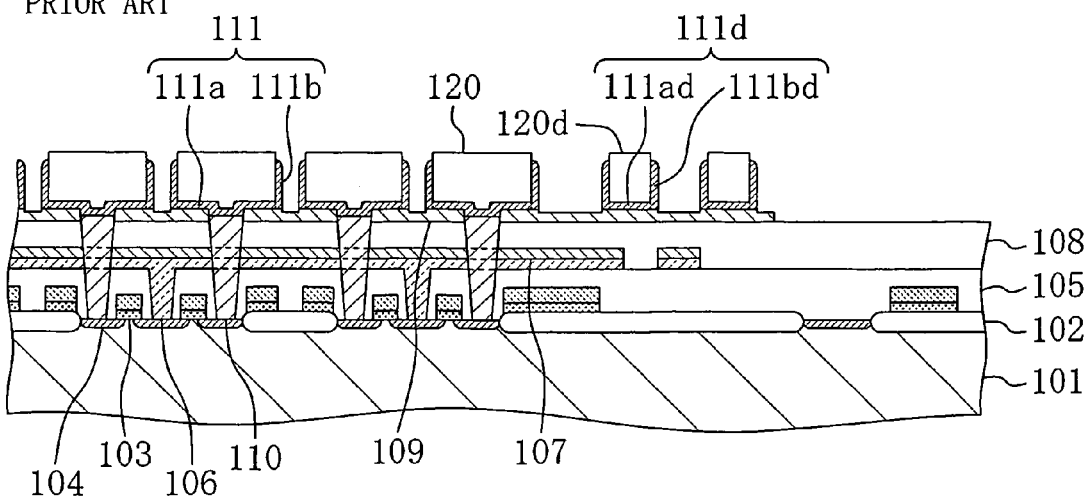
Figure 10A:
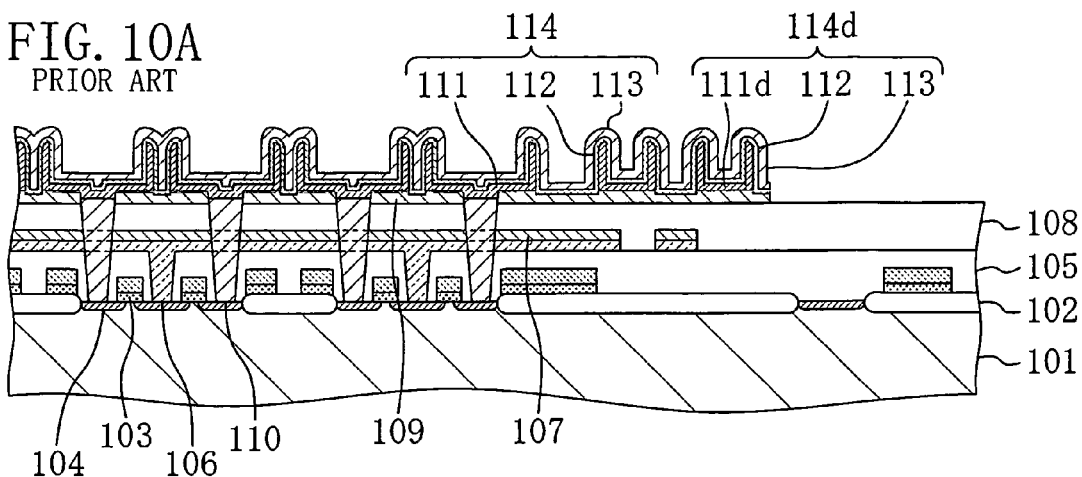
FIGS. 10A to 10C are sectional views showing main parts of the structure of the semiconductor memory device according to the conventional example.
Figure 10B:
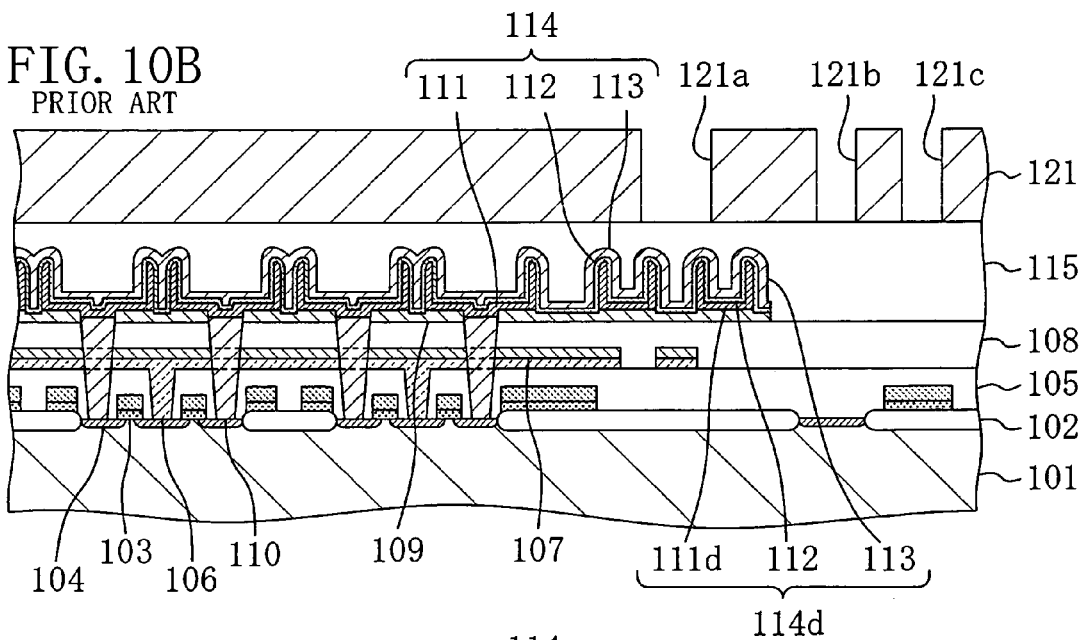
Figure 10C:
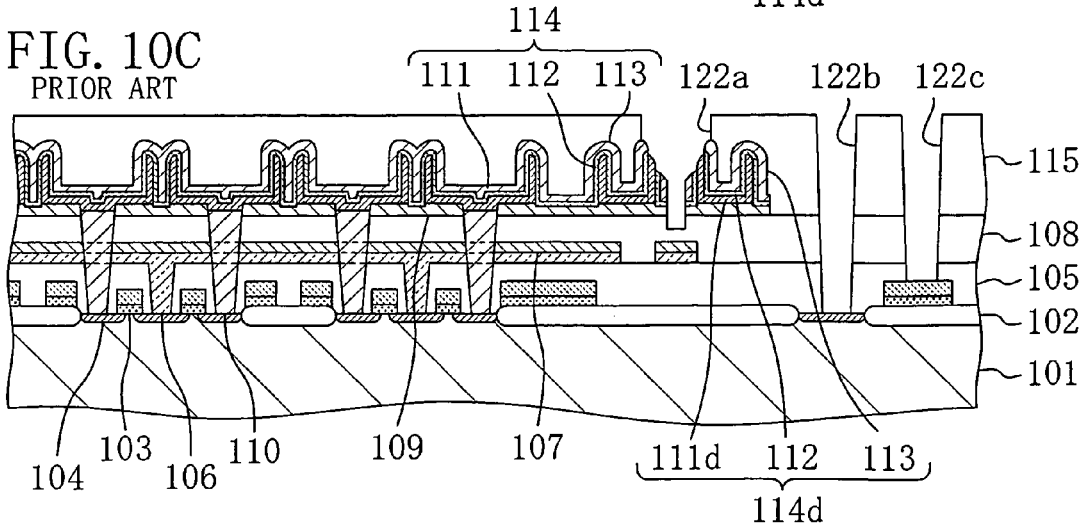
Figure 11:
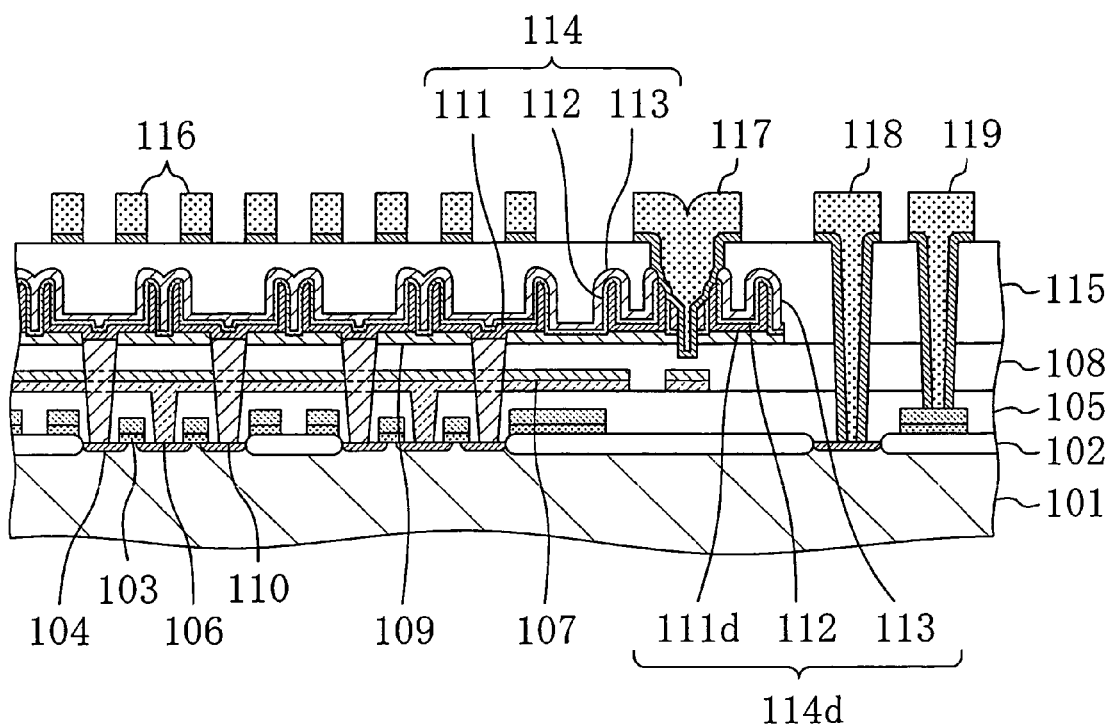
FIG. 11 is a sectional view showing main parts of the structure of the semiconductor memory device according to the conventional example.
Figure 12A:
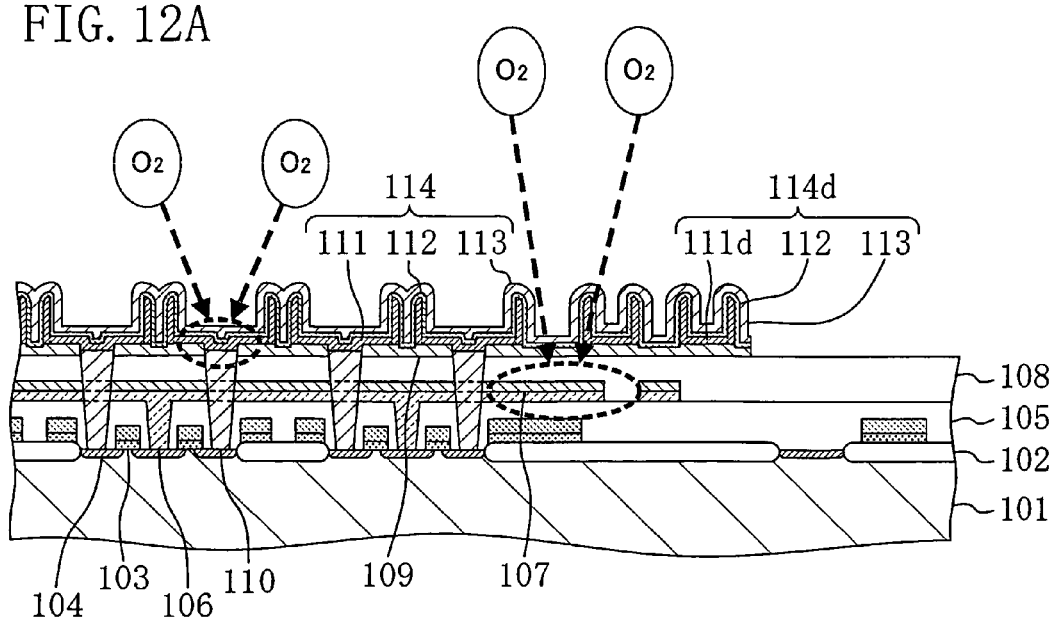
FIGS. 12A and 12B are sectional views showing main parts of the semiconductor memory device according to the conventional example, which are for explaining problems of this device.
Figure 12B:
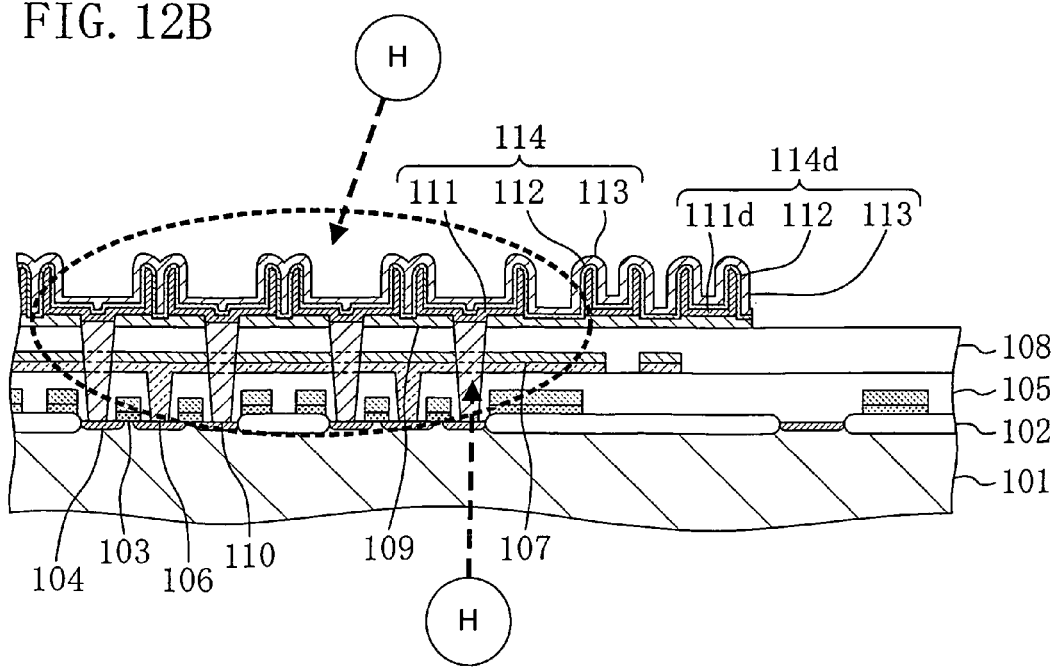

FIGS. 8A and 8B are sectional views showing main process steps of the method for fabricating a semiconductor memory device according to the second embodiment of the present invention, which are taken along the line VIIb-VIIb in FIG. 7A.

First, as shown in FIG. 8A, the gate electrode 3 is formed in the element formation region defined by the isolation region (STI) 2 in the semiconductor substrate 1. Thereafter, ion implantation using the gate electrode 3 as a mask is performed to form the doped layers 4 in the surface portion of the element formation region. This allows integration of transistors each made of the doped layers 4 and the gate electrode 3. As illustrated in this figure, the side surfaces of the gate electrode 3 are formed with the side-wall insulating films 3a, respectively, and the top surface thereof is formed with the silicide layer 3b.

Subsequently, over the entire surface of the semiconductor substrate 1, the first interlayer insulating film 5 of an ozone-based silicon dioxide ($SiO_2$) film having a thickness of 300 to 1000 nm is formed to cover the transistor, and the surface of the formed film is planarized by a CMP method or the like. By dry etching, a first contact hole 1h (note that the diameter thereof is 0.22 to 0.24 µm.) reaching the doped layer 4 is formed through the first interlayer insulating film 5, and then by either a combination of a CVD method and an etch back method or a combination of a CVD method and a CMP method, the first contact hole 1h is filled with tungsten or polysilicon to form the first contact plug 6. Thereafter, on the first interlayer insulating film 5 and the first contact plug 6, the bit line 7 of tungsten is formed to connect the lower surface thereof to the upper end of the first contact plug 6. On the entire surface of the first interlayer insulating film 5, the second interlayer insulating film 8 of an ozone-based silicon dioxide ($SiO_2$) film having a thickness of 1000 to 1500 nm is formed to cover the bit line 7, and the surface of the formed film is planarized by a CMP method or the like.

Next, by a dry etching method, the second contact hole 2ha reaching the doped layer 4 is formed in the first and second interlayer insulating films 5 and 8, the second contact hole 2hb reaching the bit line 7 is formed in the second interlayer insulating film 8, the second contact hole 2hc reaching the gate electrode 3 is formed in the first and second interlayer insulating films 5 and 8, and the second contact hole 2hd reaching the doped layer 4 is formed in the first and second interlayer insulating films 5 and 8 (note that the diameters of the second contact holes 2ha to 2hd are 0.22 to 0.24 µm). Thereafter, by either a combination of a CVD method and an etch back method or a combination of a CVD method and a CMP method, the second contact holes 2ha to 2hd are filled with tungsten or polysilicon to form the second contact plugs 9, 9a, 9b and 9c. On the entire surfaces on the second contact plugs 9, 9a, 9b, and 9c and the second interlayer insulating film 8, the first hydrogen barrier film 10 of a silicon nitride film (a SiN film) is deposited to have a thickness of about 20 to 100 nm. In this step, it is recommended that the silicon nitride film (the SiN film) deposition is performed using, for example, a low-pressure CVD method.

As shown in FIG. 8B, by a dry etching method, third contact holes 3hp to 3hs (note that the diameters thereof are 0.22 to 0.24 µm.) exposing the surfaces of the second contact plugs 9, 9a, 9b, and 9c, respectively, are formed in the first hydrogen barrier film 10. Thereafter, by either a combination of a CVD method and an etch back method or a combination of a CVD method and a CMP method, the third contact holes 3hp to 3hs are filled with a TiAlN film or a TiAl film (the thicknesses thereof are about 100 to 150 nm) to form the third contact plugs 11d, 11e, 11f, and 11g, respectively (the thicknesses thereof are about 100 to 150 nm).

The subsequent fabrication steps are carried out in the same manner as the description of the first embodiment using FIGS. 2B and 2C, FIGS. 3A to 3C, and FIGS. 4A and 4B.

As described above, the semiconductor memory device and its fabrication method according to the second embodiment of the present invention can exert not only the above-mentioned effects of the semiconductor memory device and its fabrication method according to the first embodiment of the present invention but also the following effects.

The third contact plugs 11e, 11f, and 11g serving as oxygen barrier films have diameters greater than those of the second contact plugs 9a, 9b, and 9c and the fourth contact plugs 22a, 22b, and 22c. Therefore, when the fourth contact plugs 22a, 22b, and 22c are formed to make electrical connection to the second contact plugs 9a, 9b, and 9c, respectively, the flexibility of the formation position of the fourth contact plugs 22a, 22b, and 22c is enhanced. To be more specific, in the second embodiment, an alignment margin in lithography of 0.04 µm can be secured between the second contact holes 2hb, 2hc, and 2hd and the fourth contact holes 4a, 4b, and 4c, respectively. This suppresses the occurrence of poor connection between the second contact plugs 9a, 9b, and 9c and the fourth contact plugs 22a, 22b, and 22c, respectively. Moreover, this enhances the alignment margin in lithography between the second contact holes 2hb, 2hc, and 2hd and the fourth contact holes 4a, 4b, and 4c, respectively, even in the case where the packing density of a semiconductor device has advanced to a high degree. Therefore, fabrication of a semiconductor memory device with a high packing density can be facilitated.

In the first and second embodiments described above, $SrBi_2(Ta_{1-x}Nb_x)O_9$ has been given as an exemplary material forming the capacitor insulating film 16. However, even alternative use of another ferroelectric with a bismuth-layered perovskite structure, lead zirconate titanate, barium strontium titanate, tantalum pentoxide, or the like can provide the same effects as those described above.

With the semiconductor memory device and its fabrication method according to the present invention, in the capacitor element thereof with the three-dimensional structure which is provided over the substrate and which has the capacitor insulating film of a ferroelectric film or a high dielectric film, even though the capacitor element has an elevated height, the contact hole formed can have a reduced aspect ratio. Moreover, since the oxygen barrier film is buried in the contact hole, oxidation of the contact plug by sintering of the high dielectric film or the ferroelectric film in an oxygen atmosphere can be prevented. Therefore, a highly reliable semiconductor memory device capable of stable operations can be attained. Consequently, the semiconductor memory device and its fabrication method according to the present invention is useful in a semiconductor memory device or the like which is provided with a capacitor element of a three-dimensional structure having a capacitor insulating film of a ferroelectric film or a high dielectric film, and also useful in a fabrication method of such a device.

What is claimed is:

1. A semiconductor memory device comprising:
   a first interlayer insulating film formed on a semiconductor substrate;
   a capacitor formed above the first interlayer insulating film and composed of a lower electrode, a capacitor insulating film of a high dielectric film or a ferroelectric film, and an upper electrode;
   a second interlayer insulating film formed over the first interlayer insulating film to cover the capacitor;

a first contact plug formed in the first interlayer insulating film to penetrate the first interlayer insulating film; and a second contact plug formed in the second interlayer insulating film to penetrate the second interlayer insulating film to make connection to the first contact plug, wherein between the first and second contact plugs, a third contact plug comprising a first oxygen barrier film is interposed to come into contact with part of the boundary area between the first and second interlayer insulating films.

2. The device of claim 1, wherein the first oxygen barrier film has the hydrogen barrier property, the device further comprises a first hydrogen barrier film formed between the first and second interlayer insulating films and between the first interlayer insulating film and the capacitor, and the first oxygen barrier film is formed to penetrate the first hydrogen barrier film.

3. The device of claim 2, further comprising a second hydrogen barrier film of insulation formed to cover the capacitor and to come into contact with the first hydrogen barrier film.

4. The device of claim 2, wherein the first hydrogen barrier film is made of $SiN_x$.

5. The device of claim 1, wherein the first oxygen barrier film has a diameter greater than those of the first and second contact plugs.

6. The device of claim 1, further comprising a fourth contact plug formed in the first interlayer insulating film to penetrate the first interlayer insulating film, and a second oxygen barrier film is interposed between the fourth contact plug and the capacitor.

7. The device of claim 6, wherein the second oxygen barrier film has the hydrogen barrier property.

8. The device of claim 6, wherein the second oxygen barrier film is made of one or more materials selected from the group consisting of k, $IrO_x$, TiAlN, TiAl, TiSiN, TaN, TaSiN, TaAlN, and TaAl, and made of the same material as the first oxygen barrier film.

9. The device of claim 1, wherein the first oxygen barrier film is made of one or more materials selected from the group consisting of Ir, $IrO_x$, TiAlN, TiAl, TiSiN, TaN, TaSiN, TaAlN, and TaAl.

10. The device of claim 1, wherein the capacitor has a three-dimensional structure.

11. The device of claim 1, wherein contact between the first contact plug and the third contact plug only occurs at an upper surface of the first contact plug, and contact between the second contact plug and the third contact plug only occurs at a bottom surface of the second contact plug.

* * * * *